US007308628B2

(12) United States Patent
Spirkl et al.

(10) Patent No.: US 7,308,628 B2
(45) Date of Patent: Dec. 11, 2007

(54) INPUT SWITCHING ARRANGEMENT FOR A SEMICONDUCTOR CIRCUIT AND TEST METHOD FOR UNIDIRECTIONAL INPUT DRIVERS IN SEMICONDUCTOR CIRCUITS

(75) Inventors: Wolfgang Spirkl, Germering (DE); Ralf Arnold, Poing (DE)

(73) Assignee: Infineon Technologies, AG, Neubiberg (DE)

( * ) Notice: Subject to any disclaimer, the term of this patent is extended or adjusted under 35 U.S.C. 154(b) by 250 days.

(21) Appl. No.: 10/988,541

(22) Filed: Nov. 16, 2004

(65) Prior Publication Data
US 2005/0108603 A1    May 19, 2005

(30) Foreign Application Priority Data
Nov. 17, 2003   (DE) ................ 103 53 585

(51) Int. Cl.
*G01R 31/28* (2006.01)
(52) U.S. Cl. .................................... 714/724
(58) Field of Classification Search ............... 714/724, 714/727, 700
See application file for complete search history.

(56) References Cited
U.S. PATENT DOCUMENTS
4,970,410 A   11/1990  Matsushita et al.
5,594,694 A *  1/1997  Roohparvar et al. ........ 365/201
6,397,361 B1   5/2002  Saitoh
6,421,801 B1*  7/2002  Maddux et al. ............. 714/744
6,477,674 B1* 11/2002  Bates et al. ................. 714/738
2003/0030461 A1  2/2003  Oberle et al.

FOREIGN PATENT DOCUMENTS
JP           09257884 A     10/1997

* cited by examiner

Primary Examiner—James C. Kerveros
(74) Attorney, Agent, or Firm—Edell, Shapiro & Finnan, LLC

(57) ABSTRACT

Transfer switching devices, which supplement unidirectional input switching arrangements or pad circuits are employed to route an internal test signal to the input of an input driver in the unidirectional input switching arrangement and to couple the internal test signal to an internal switching logic unit. The transfer switching devices are controlled via a multiplexer unit, which can be programmed directly using boundary scan registers. The present invention allows all unidirectional pad circuits or input drivers to be tested in the course of a reduced I/O test method for semiconductor circuits, in which testing internal circuits in the semiconductor circuit involves only a subset of the signal connections associated with the input drivers being coupled to a test apparatus.

9 Claims, 3 Drawing Sheets

US 7,308,628 B2

INPUT SWITCHING ARRANGEMENT FOR A SEMICONDUCTOR CIRCUIT AND TEST METHOD FOR UNIDIRECTIONAL INPUT DRIVERS IN SEMICONDUCTOR CIRCUITS

CROSS REFERENCE TO RELATED APPLICATIONS

This application claims priority under 35 USC § 119 to German Application No. DE 103 53 585.3, filed on Nov. 17, 2003, and titled "Input Switching Arrangement, Semiconductor Circuit And Test Method For Unidirectional Input Drivers In Semiconductor Circuits," the entire contents of which are hereby incorporated by reference.

FIELD OF THE INVENTION

The invention relates to an input switching arrangement for semiconductor circuits and a method for testing unidirectional input drivers in semiconductor circuits. More particulary, the invention relates to semiconductor circuits having a signal connection and a unidirectional input driver coupled to the signal connection and suitable for conditioning the input signal applied to the signal connection into an internal input signal allowing processing by internal circuits coupled to the input switching arrangement.

BACKGROUND

In complex semiconductor circuits such as DRAMs (dynamic random access memories), the test costs are a significant part, currently approximately 15% to 20%, of the total production costs. Semiconductor circuits are normally tested on programmable test apparatuses (e.g., component testers). To increase the throughput of semiconductor circuits to be tested on the cost-intensive test apparatuses, short test times and a high level of test parallelism are the aim. The test time is prescribed by the functionality of the semiconductor circuit. The number of semiconductor circuits which can be tested simultaneously on a test apparatus is limited by the number of test channels in the test apparatus.

To increase the throughput on the test apparatuses, "reduced-I/O" test methods are therefore customary, requiring contact to be made only with some of the signal connections on the semiconductor circuit to be tested. In a reduced-I/O test method with a self-test unit inside the component, the functionality of internal circuits in the semiconductor circuit is tested by an internal self-test. The signal connections coupled to the test apparatus are used merely to initiate the internal self-test and to transmit a test result for the self-test to the test apparatus. The number of test channels required per semiconductor circuit is significantly reduced.

Further reduced-I/O test methods are scanpath and boundary scan test methods, whose performance requires contact to be made with a subset of the signal connections on the semiconductor circuit to be tested.

Disadvantageously, conventional reduced-I/O test methods do not test the signal connections which are unused during the test and are not coupled to the test apparatus, or the input or output switching arrangements (I/O pads, pad circuits) associated with the unused signal connections. Besides the signal connection, an I/O pad comprises an output driver, which is able to drive an output signal generated by internal circuits in the semiconductor circuit on a signal line coupled to the signal connection, and/or an input driver, which conditions an input signal applied to a signal connection in a manner which is suitable for the internal circuits, and also a connecting line between the signal connection and the input or output driver.

In the simplest case, the I/O pads which are not tested in the course of a reduced-I/O test method are tested by a further pass on the same or on another test apparatus, in which case, with an appropriately low level of test parallelism, all signal connections on the semiconductor circuit to be tested are coupled to a respective test channel in the test apparatus.

Japanese patent number JP-09-257884 A describes a test method for unidirectional input drivers in a semiconductor circuit, in which the input drivers are connected, in a test mode, to a ring oscillator via controllable selector circuits in order to test the basic functionality of the input drivers by evaluating the oscillation by the ring oscillator. In this context, the selector circuits are respectively connected between the input of the input driver and the respective associated signal connection.

German patent number DE 101 38 556 C1 (Oberle, Sattler) describes one option for testing bidirectional I/O pads with which there is no contact within the context of a reduced-I/O test method, which option involves the bidirectional I/O pads being tested by returning a test signal via the output driver for the I/O pad to the input of the input driver for the same I/O pad, and from there to an evaluation logic unit inside the component. To test unidirectional I/O pads, the German patent proposes that a respective unidirectional I/O pad with an input driver and a unidirectional I/O pad with an output driver be coupled to one another outside of the semiconductor circuit.

SUMMARY OF THE INVENTION

The invention is based on the object of providing a unidirectional input switching arrangement which allows the associated input driver to be tested without making contact with the associated signal connection. The object also includes a semiconductor circuit having a plurality of unidirectional input switching arrangements and a test method for unidirectional input drivers in semiconductor circuits.

An input switching arrangement for semiconductor circuits comprises a signal connection and a unidirectional input driver coupled to the signal connection. The input driver conditions an input signal applied to the signal connection externally in a manner which allows the processing in internal circuits coupled to the input switching arrangement.

The inventive unidirectional input switching arrangement also comprises a bidirectional transfer switching device which is suitable for transmitting test signals and which can be controlled by a test control signal and, in a test mode in the semiconductor circuit, connects the respective input of the input driver which is coupled to the signal connection to a test signal line.

The test signal line is used to route a test signal which is suitable for testing a parameter of the input driver to the input of the input circuit. Outside of the test mode, in the intended operating state of the semiconductor circuit, the test signal line is isolated from the input driver's connection coupled to the signal connection by the open transfer switching device. The inventive unidirectional input switching arrangement allows unidirectional input drivers to be tested in a similar manner, as described in German patent number DE 101 38 556 C1 for bidirectional circuits. Preferably, the transfer switching device is in the form of a transfer gate comprising an n-channel field effect transistor (FET) and a p-channel FET which is arranged in parallel with the n-channel FET and is actuated using the inverted test control signal.

Since no load is required at the associated signal connection in order to test the input circuit, the transfer gate may be produced with small dimensions, which means that the input capacity of the input driver remains low and the properties of the input switching arrangement are not impaired for the intended operating mode.

In comparison with a solution which made provision for all unidirectional input circuits to be in the form of bidirectional I/O pads, the inventive input switching arrangement has the advantage that the transfer gate takes up less surface area on a semiconductor substrate than an output driver, which turns out to be comparatively large within the usual technology. In addition, a transfer gate increases the input capacity of the input circuit to a lesser extent than an output driver in conventional technology.

In one preferred embodiment of the inventive input switching arrangement, a bypass switching device is provided which connects a test signal transmitted on the test signal line either to the transfer switching device or to a connection on the input driver. In one case, the test signal is routed to the input of the input driver via the transfer switching device, and in the other case it is routed directly to the output of the input driver.

The bypass switching device may therefore be used to connect an individual input driver to the signal path for the test signal. This allows the propagation time delay for an individual input driver to be measured and allows a plurality of unidirectional input drivers to be lined up in series along a single test signal line.

With particular advantage, a signal path between the signal connection and the transfer switching device is produced in series with a connecting line which connects the signal connection to the input driver. The connecting line and the signal path are then routed to the signal connection in isolation from one another. The functional test also covers the connecting line between the signal connection and the input driver.

Besides internal circuits which are suitable for processing and generating signals, a semiconductor circuit based on the invention has a plurality of input switching arrangements of the described type with, respectively, a signal connection and a unidirectional input driver for receiving the signals which are to be processed. Preferably, the semiconductor circuit also comprises a multiplexer unit which, in a test mode in the semiconductor circuit, controls the transfer and bypass switching devices in the input switching arrangements. To this end, the multiplexer unit with first multiplexer switching devices for routing the test control signals is provided. Second multiplexer switching devices are used to connect one or more test signals from a test signal source to the input driver(s) to be tested. Third multiplexer switching devices are used to connect an output signal from the respective input driver(s) to be tested to an evaluation unit. In addition, the multiplexer unit comprises register units for controlling the state of the transfer, bypass and multiplexer switching devices.

Both the test signal source and the evaluation unit may be provided in a test apparatus outside of the semiconductor circuit and may be coupled to a respective signal connection on the semiconductor circuit.

Preferably, the test signal source for outputting test signals suitable for testing the input drivers and the internal evaluation unit are provided inside of the semiconductor circuit.

With particular preference, the semiconductor circuit comprises a test port which can be used to control the multiplexer unit. A test port of this type can be a boundary scan access port, for example, which the test apparatus can use to write to boundary scan registers within the semiconductor circuit. The multiplexer unit can be controlled using the boundary scan registers.

In line with the invention, the parameters "leakage current", "pull up current", "pull down current" or "rise/fall time out to in", for example, of the I/O pads are tested in parallel with or at the same time as the functionality of the internal circuits in the semiconductor circuit on the same test apparatus.

Within the course of an inventive test method for a semiconductor circuit having a plurality of input/output switching arrangements (I/O pads), which each have a signal connection, and internal circuits coupled to the I/O pads, a respective first subset of the signal connections is coupled to a test apparatus. The internal circuits are tested in a reduced-I/O mode in the semiconductor circuit using the first genuine subset of the signal connections.

A second subset of signal connections (which are each associated with unidirectional input switching arrangements), which is not contained in the first subset, can be coupled to an internal test signal line on the basis of test control signals generated in the test mode. A test signal can be generated which can be transmitted on the test signal line. Using the internal test signals, at least those input drivers which are associated with the second subset of signal connections are tested.

To test a semiconductor circuit, a reduced number of test channels in the test apparatus is required. The test method supplements known reduced-I/O test methods for testing internal circuits in the semiconductor circuit with an extensive and meaningful test for those I/O pads which are regularly not covered by ordinary reduced-I/O test methods.

To test a propagation time delay tpd for an input driver, the input of the input driver is coupled to a test signal source via the test signal line, and the output of the input driver is coupled to an evaluation unit. A driver propagation time for a signal transmitted from the test signal source to the evaluation unit can be recorded. A bypass switching device can be used to bypass the transfer switching devices and the input driver can be used to turn off the input driver or to uncouple the output of the input driver via a further multiplexer unit, and a bypass propagation time is recorded for a signal transmitted from the test signal source to the evaluation unit. The difference between the driver propagation time and the bypass propagation time gives the propagation time delay tpd.

To test the leakage current for an I/O pad via the test signal line, the associated signal connection is charged to a defined level (pad potential). The test signal line is then disconnected. If a leakage current to the positive or negative supply voltage arises, the pad potential changes accordingly. The charging/discharge time is a function of the magnitude of the leakage current. After a predetermined time, the output of the I/O pad is read into a boundary scan register and evaluated.

The above features and advantages of the present invention will become apparent upon consideration of the following detailed description of specific embodiments thereof, particularly when taken in condjunction with the accompanying drawings wherein like reference numerals in the various figures are utilized to designate like components.

BRIEF DESCRIPTION OF THE FIGURES

The invention is explained in more detail below with reference to the figures, in which.

DETAILED DESCRIPTION

Figure 1:
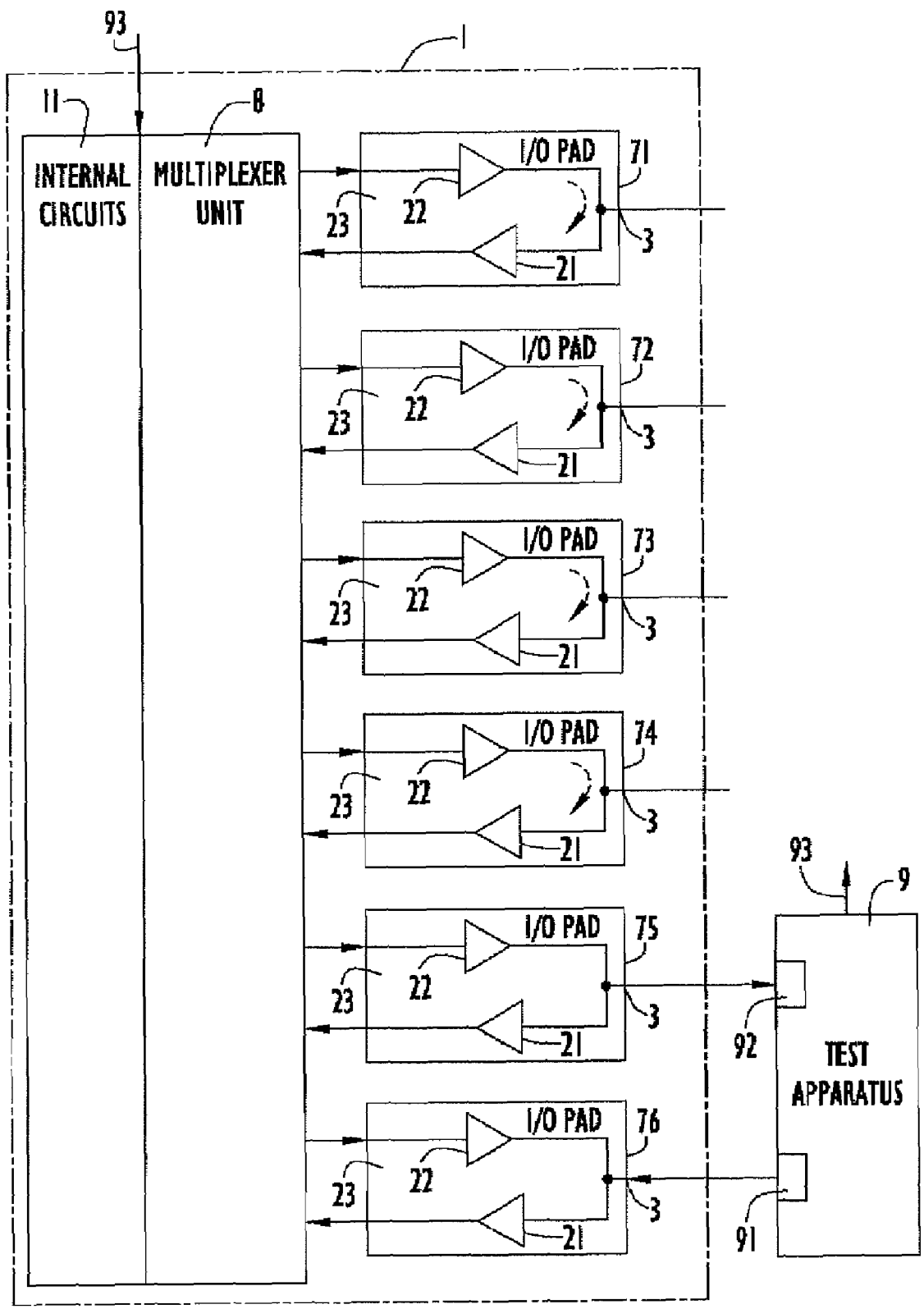
FIG. 1 shows a conventional test apparatus for bidirectional input switching arrangements.

FIG. 1 illustrates a conventional test method (described in the cited prior art) for bidirectional I/O pads 71, 72, . . . in a semiconductor circuit 1, in which only a subset of the signal connections 3 of the semiconductor circuit 1 is coupled to a test apparatus 9.

Besides the I/O pads 71, 72, . . . , the semiconductor circuit 1 comprises internal circuits 11. The bidirectional I/O pads 71, 72, . . . each have an input driver 21 and an output driver 22. The output driver 22 drives a signal generated in the internal circuits 11 on a signal line which is coupled to the respective associated signal connection 3. The input driver 21 conditions an input signal applied to the signal connection 3 in a manner which is suitable for processing in the internal circuits 11. The input driver 21 and the output driver 22 together form a bidirectional driver circuit 23. Together with the associated signal connections 3, the bidirectional driver circuit 23 forms a bidirectional input/output switching arrangement (I/O pad) 71, 72, . . . .

To test the semiconductor circuit 1, the semiconductor circuit is coupled to the test apparatus 9 via a test control bus 93. The test control bus 93 can be used to control an internal test in the internal circuits 11 and to output a test result. In addition, the test control bus 93 can be used to control a multiplexer unit 8 which is provided between the internal circuits 11 and the I/O pads 71, 72, . . . and is suitable for controlling a test for the signal connections 3 which are not coupled to the test apparatus 9.

The multiplexer unit 8 comprises multiplexer switching devices and, by way of example, a boundary scan register logic unit. An I/O pad 76 can be coupled to a first test channel 91 in the test apparatus 9, and a second I/O pad 75 can be coupled to a second test channel 92 in the test apparatus 9.

To measure the parameter $t_{pdoutin}$ (round trip propagation delay) for the bidirectional I/O pad 72, the test apparatus 9 outputs a rising edge of a test signal on the test channel 91 and loops it through the input driver for the I/O pad 76 to the multiplexer unit 8. The multiplexer unit 8 can be used to route the test signal to the output driver 22 for the I/O pad 72. The test signal can be read back by the input driver for the same I/O pad 72 and can be forwarded to the test channel 92 in the test apparatus 9 via the multiplexer unit 8 and the output driver 22 for the I/O pad 75. The test apparatus 9 records the delay for the signal received on the test channel 92 as compared with the signal which can be output by the test channel 91.

Figure 2:
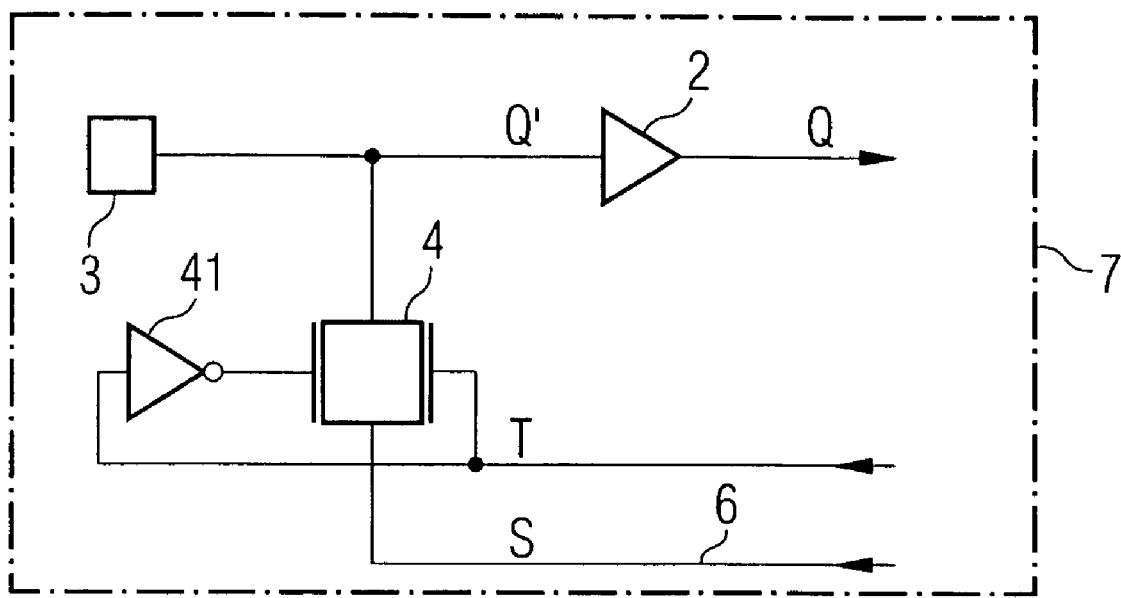
FIG. 2 shows an output switching arrangement in accordance with an embodiment of the present invention.
Figure 3:
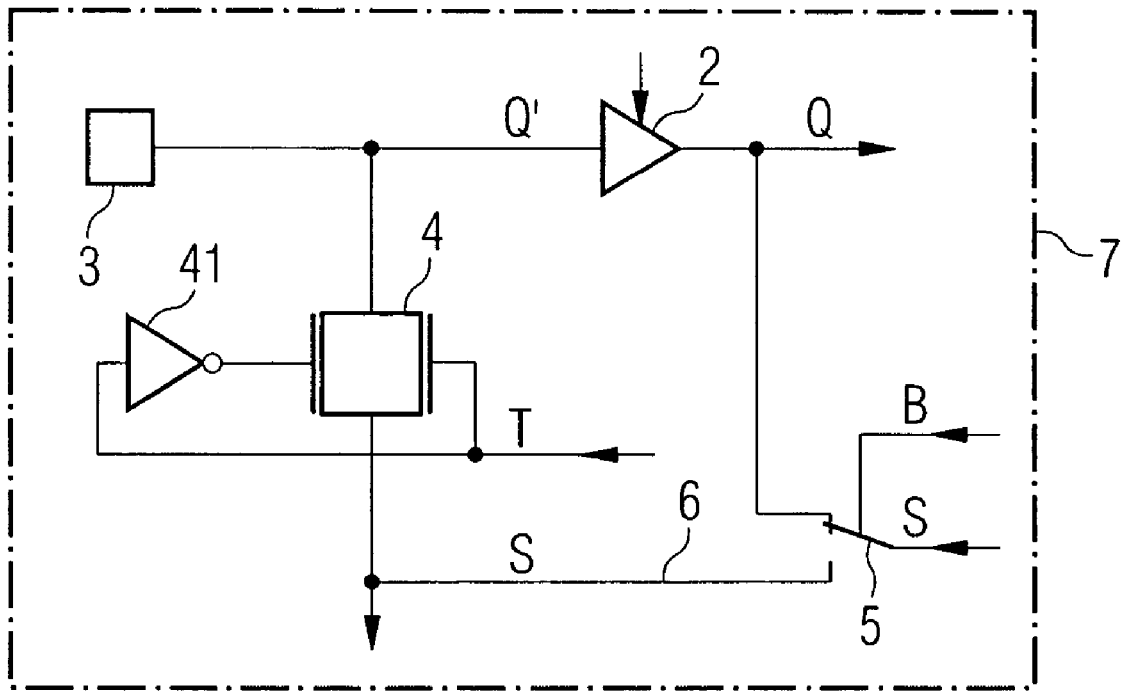
FIG. 3 shows an output switching arrangement based in accordance with an additional embodiment of the present invention.

The exemplary embodiment of an I/O pad 7 which is shown in FIG. 2 comprises a signal connection 3 and an input driver 2. The input driver 2 converts an external signal Q' applied to the signal connection 3 into an internal signal Q. A controllable transfer switching device 4 is arranged between the input of the input driver 2 and a test signal line 6. The transfer switching device 4 can be controlled via a test control signal T. The transfer switching device 4 can be in the form of a transfer gate comprising an n-channel FET and a p-channel FET connected in parallel with the n-channel FET. The p-channel FET can be actuated via an inverter 41 using the inverted test control signal. In the intended operating state or in normal operation of a semiconductor circuit, the test control signal T has a "low" level, and the transfer switching device 4 can be off. In the course of a test on the input driver 2, the transfer switching device 4 can be turned on and a test signal S transmitted on the test signal line 6 can be coupled to the input of the input driver The pad circuit 7 shown in FIG. 3 differs from the input switching arrangement in FIG. 2 by virtue of an additional bypass switching device 5. The bypass switching device 5 is controlled by means of a further internal bypass control signal B and couples the interrnal test signal S either via the transfer switching device 4 to the input of the input driver 2 or directly to the output of the input driver 2.

To measure the propagation time delay for the input driver 2, the signal propagation time of a test signal S which is routed via the bypass switching device 5, the transfer switching device 4 and the input driver 2 can be first ascertained. In a second step, the signal propagation time of the test signal S coupled to the output of the input driver 2 is ascertained, followed by the difference between the two propagation times.

Figure 4:
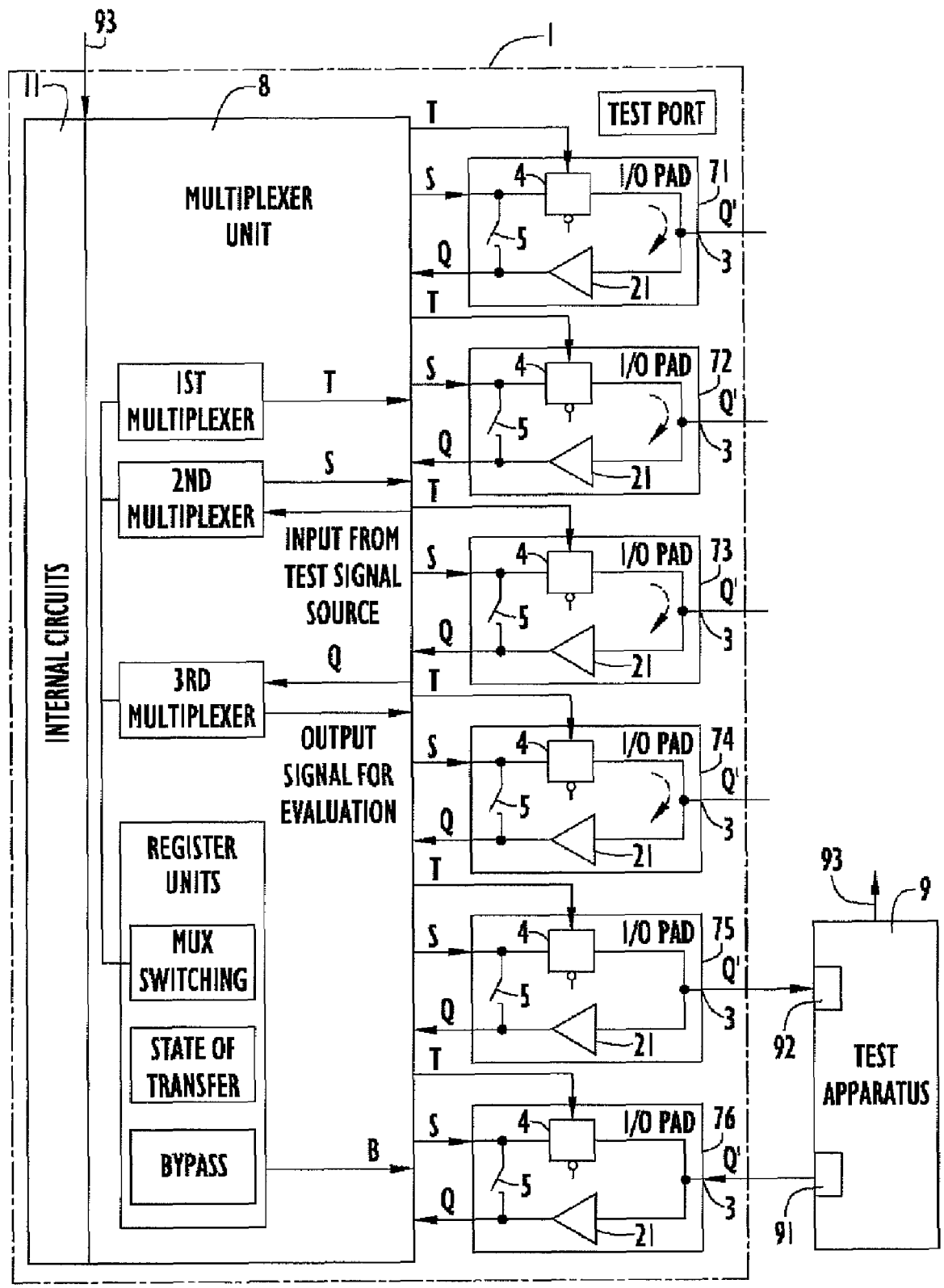
FIG. 4 shows an inventive semiconductor circuit based in accordance with a further embodiment of the present invention.

FIG. 4 shows a semiconductor circuit in accordance with an embodiment of the present invention. Unlike in FIG. 1, the I/O pads 71, 72, . . . in FIG. 4 are unidirectional input drivers 21 for which a test method as illustrated in FIG. 1 is not readily possible. By integrating transfer switching devices 4 into the pad circuits 71, 72, . . . , it is possible to route a respective test signal S to the input of the input driver 21. Adaptations in the multiplexer unit 8 make it possible to measure parameters for the input drivers 21 in line with the test method described in FIG. 1 for bidirectional driver circuits or pad circuits. Parameters for the input driver such as switching threshold (input threshold), leakage current (input leakage) and pull up/pull down functionality may be recorded in this case even without connecting test channels 91, 92.

For pad circuits which are associated with a differential input signal, for example a differential clock input, a respective one of the two signal connections in the differential pad circuit is coupled to a reference potential, while the respective other signal connection is tested in line with a signal connection in a non-differential pad circuit. The second signal connection is then coupled to the reference potential, and the first signal connection is tested in the manner of a signal connection in a non-differential pad circuit.

Alternatively, both signal connections in a differential pad circuit are coupled to the internal test signals.

Having described preferred embodiments of a new and improved method and and apparatus for an input switching arrangement and a semiconductor circuit and test method for a unidirectional input driver in a semiconductor circuit, it is believed that other modifications, variations and changes will be suggested to those skilled in the art in view of teachings set forth herein. It is therefore to be understood that all such variations, modifications and changes are believed to fall within the scope of the present invention by the appended claims.

LIST OF REFERENCE SYMBOLS

1 Semiconductor circuit
11 Internal circuit
2 Input driver
21 Input driver
23 Bidirectional driver circuit
3 Signal connection
4 Transfer switching device
41 Inverter
5 Bypass switching device
6 Test signal line
7 IO-pad
71 IO-pad
72 IO-pad
73 IO-pad
74 IO-pad
75 IO-pad
76 IO-pad
8 Multiplexer unit
9 Test apparatus
91 Test channel
92 Test channel
93 Test control bus
B Bypass control signal
Q Conditioned input signal
Q' Received input signal
D Output signal
D' Conditioned output signal
S Test signal
T Test control signal

We claim:

1. A unidirectional input switching arrangement for a circuit, comprising:
   a signal connection configured to couple with and receive an input signal from a test apparatus;
   a unidirectional input driver connected to the signal connection via an input of the input driver, the unidirectional input driver being operable to condition the input signal applied to the signal connection into an internal input signal to be processed by internal circuits, wherein the internal circuits are coupled via a connection line to an output of the input driver; and
   a transfer switching device, which is configured to be controlled by a test control signal and which, during a test mode of the circuit, is configured to couple the input of the input driver to a test signal line, wherein the test signal line is configured to route a test signal to the input of the input driver to facilitate testing of a parameter of the input driver.

2. The input switching arrangement as claimed in claim 1, further comprising:
   a bypass switching device configured to route the test signal transmitted on the test signal line to the transfer switching device or to the connection line that couples the output of the input driver to the internal circuits.

3. The input switching arrangement as claimed in claim 1, wherein a signal path between the signal connection and the transfer switching device is produced in isolation from a connecting line which couples the signal connection to the input driver.

4. A circuit, comprising:
   internal circuits operable for processing and generating signals;
   a plurality of input switching arrangements, each input switching arrangement including:
   a signal connection configured to couple with and receive an input signal from a test apparatus;
   a unidirectional input driver connected to the signal connection via an input of the input driver, the unidirectional input driver being operable to condition the input signal applied to the signal connection into an internal input signal to be processed by the internal circuits, wherein the internal circuits are coupled via a connection line to an output of the input driver; and
   a transfer switching device, which is configured to be controlled by a test control signal and which, during a test mode of the circuit, is configured to couple the input of the input driver to a test signal line, wherein the test signal line is configured to route a test signal to the input of the input driver to facilitate testing of a parameter of the input driver.

5. The semiconductor circuit as claimed in claim 4, further comprising:
   a multiplexer unit which, during a test mode in the semiconductor circuit, controls the switching devices in the input switching arrangement, the multiplexer unit comprising:
   first multiplexer switching devices configured to route the test control signals;
   second multiplexer switching devices configured to route the test signal from a test signal source to an input driver to be tested;
   third multiplexer switching devices configured to route an output signal from respective input drivers to be tested to an evaluation unit; and
   register units configured to control the state of switching devices in the input switching arrangement and the first, second, and third multiplexer switching devices.

6. The semiconductor circuit as claimed in claim 5, further comprising at least one of an internal evaluation unit and a test signal source configured to output the test signal.

7. The semiconductor circuit as claimed in claim 5, further comprising:
   a test port configured to control the multiplexer unit.

8. A method for testing a circuit comprising a plurality of unidirectional input switching arrangements each including a signal connection, and internal circuits connected to the input switching arrangements, the method comprising:
   coupling a respective first subset of the signal connections to a test apparatus;
   testing the internal circuits in a test mode using the first subset of the signal connections;
   coupling at least one second subset of signal connections which is not contained in the first subset to internal test signal lines on the basis of test control signals generated in the test mode;
   generating a test signal transmitted on the test signal line; and
   using the internal test signal lines to test the input switching arrangements associated with the second subset of signal connections.

9. The method as claimed in claim 8, further comprising:
   coupling the input of the input switching arrangement to a test signal source via the test signal line, and coupling the output of the input switching arrangement to an evaluation unit;
   recording a driver propagation time for a test signal transmitted from the test signal source to the evaluation unit;

using a bypass switching device to bypass the switching device and an input driver in the input switching arrangement, and recording a bypass propagation time for a second test signal transmitted from the test signal source to the evaluation unit; and using the difference between the driver propagation time and the bypass propagation time to ascertain the propagation time delay for the input driver.

* * * * *